(12) United States Patent
Huang et al.

(10) Patent No.: US 10,816,398 B2
(45) Date of Patent: Oct. 27, 2020

(54) SPECTROMETER AND SPECTRUM MEASUREMENT METHOD THEREOF

(71) Applicant: InnoSpectra Corporation, Hsinchu County (TW)

(72) Inventors: Yung-Yu Huang, Hsinchu County (TW); Hsi-Pin Li, Hsinchu County (TW); He-Yi Hsieh, Hsinchu County (TW); Cheng-Hsiung Chen, Hsinchu County (TW); Ming-Hui Lin, Hsinchu County (TW)

(73) Assignee: InnoSpectra Corporation, Hsin-Chu (TW)

( * ) Notice: Subject to any disclaimer, the term of this patent is extended or adjusted under 35 U.S.C. 154(b) by 155 days.

(21) Appl. No.: 15/854,672

(22) Filed: Dec. 26, 2017

(65) Prior Publication Data

US 2018/0209845 A1    Jul. 26, 2018

(30) Foreign Application Priority Data

Jan. 24, 2017    (CN) .......................... 2017 1 0059680

(51) Int. Cl.
*H01J 40/14*    (2006.01)
*G01J 1/44*    (2006.01)
(Continued)

(52) U.S. Cl.
CPC . *G01J 1/44* (2013.01); *G01J 1/18* (2013.01); *G01J 3/28* (2013.01); *G01J 3/2803* (2013.01); (Continued)

(58) Field of Classification Search
CPC .... G01J 1/44; G01J 3/28; G01J 3/2803; G01J 1/18; H03G 3/001; H03G 3/3084; H05B 47/105
(Continued)

(56) References Cited

U.S. PATENT DOCUMENTS 5,053,771 A * 10/1991 McDermott .......... H03M 1/188
                                                        341/139
8,035,816 B2 * 10/2011 Randow .................... G01J 3/02
                                                        356/343
(Continued)

FOREIGN PATENT DOCUMENTS

CN            1411141        4/2003
CN           103512659       1/2014
(Continued)

OTHER PUBLICATIONS

"Office Action of China Counterpart Application", dated Mar. 17, 2020, p. 1-p. 8.

*Primary Examiner* — Georgia Y Epps
*Assistant Examiner* — Kevin Wyatt
(74) *Attorney, Agent, or Firm* — JCIPRNET

(57) ABSTRACT

A spectrometer and a spectrum measurement method thereof are provided. An analog-to-digital converter converts an amplified signal into a digital signal according to a reference voltage provided by a variable reference voltage generation circuit and amplifies the digital signal according to a target signal value, thereby approximating a signal value of the amplified digital signal to the target signal value. A control circuit outputs a spectral signal according to the amplified digital signal. A user can obtain spectrum measurement results that can be easily interpreted by the spectrometer and the spectrum measurement method thereof, without changing hardware or software, so as to improve convenience of use of the spectrometer.

6 Claims, 4 Drawing Sheets

(51) Int. Cl.
*G01J 3/28* (2006.01)
*H03G 3/00* (2006.01)
*H03G 3/30* (2006.01)
*G01J 1/18* (2006.01)
*H05B 47/105* (2020.01)

(52) U.S. Cl.
CPC ........... *H03G 3/001* (2013.01); *H03G 3/3084* (2013.01); *H05B 47/105* (2020.01)

(58) Field of Classification Search
USPC ........................................................ 250/226
See application file for complete search history.

(56) References Cited

U.S. PATENT DOCUMENTS

| | | | | |
|---|---|---|---|---|
| 8,502,981 | B2* | 8/2013 | Bonyuet | G01J 3/02 356/418 |
| 8,797,522 | B2* | 8/2014 | Namba | G01J 1/10 356/226 |
| 8,922,766 | B2 | 12/2014 | Nozawa | |
| 2008/0008336 | A1* | 1/2008 | Tanaka | H03G 3/3026 381/104 |
| 2008/0316342 | A1* | 12/2008 | Rossi | H03M 1/1019 348/294 |
| 2010/0027004 | A1 | 2/2010 | Bonyuet et al. | |
| 2012/0020529 | A1* | 1/2012 | Chen | H04N 5/145 382/107 |
| 2013/0107260 | A1* | 5/2013 | Nozawa | G01J 3/42 356/402 |
| 2015/0219493 | A1* | 8/2015 | Bungo | G01J 3/18 356/319 |
| 2015/0260570 | A1* | 9/2015 | Jung | G01J 1/44 250/214.1 |

FOREIGN PATENT DOCUMENTS

| | | |
|---|---|---|
| CN | 103983606 | 8/2014 |
| TW | I439683 | 6/2014 |
| TW | 201425907 | 7/2014 |

* cited by examiner

SPECTROMETER AND SPECTRUM MEASUREMENT METHOD THEREOF

CROSS-REFERENCE TO RELATED APPLICATION

This application claims the priority benefit of China application serial no. 201710059680.8, filed on Jan. 24, 2017. The entirety of the above-mentioned patent application is hereby incorporated by reference herein and made a part of this specification.

BACKGROUND

Field of the Invention

The invention relates to a measurement apparatus and more particularly, to a spectrometer and a spectrum measurement method thereof.

Description of Related Art

Generally, spectrometers are widely used in material analysis applications. The spectrometers may perform a material analysis operation according to light characteristics (e.g., light wavelength) which appear after the light is absorbed or reflected by an unknown sample. In general, common spectrometers, according to different measurement methods, may be classified to measure reflected light, transmission light or light to be measured input through optical fibers, and as different measurement methods correspond to different light intensities, measurement parameters used correspondingly are different. In addition, if characteristics of testing objects (e.g., light absorbance of the objects) significantly vary, or a light source providing the light for the measurement is aged and attenuated, the measurement parameters also have to be adjusted. In these conditions, either hardware or software usually has to be modified to avoid an issue that spectrum measurement results cannot be interpreted by a user or a processor, as well as avoid inconvenience to the user due to a finally displayed spectrum failing to clearly present the characteristics of a testing object.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a spectrometer and a spectrum measurement method thereof, by which a user can obtain a spectrum measurement result that can be easily interpreted, without any hardware or software modification, so as to improve convenience of use of the spectrometer.

Additional aspects and advantages of the invention will be set forth in the description of the techniques disclosed in the invention.

To achieve one of, a part of or all of the above-mentioned advantages, or to achieve other advantages, an embodiment of the invention provides a spectrometer including a first light sensor, a variable gain amplifier, a variable reference voltage generation circuit, an analog-to-digital converter (ADC) and a control circuit. The first light sensor senses light to be measured from a testing object to generate a sensing signal. The variable gain amplifier is coupled to the first light sensor to amplify the sensing signal to generate an amplified signal. The variable reference voltage generation circuit provides a reference voltage. The analog-to-digital converter is coupled to the variable gain amplifier and the variable reference voltage generation circuit, converts the amplified signal into a digital signal according to the reference voltage and amplifies the digital signal according to the target signal value, thereby approximating the signal value of the amplified digital signal to a target signal value. The control circuit is coupled to analog-to-digital converter and outputs a spectral signal according to the amplified digital signal.

The invention further provides a spectrum measurement method of a spectrometer, including the following steps. Light to be measured from a testing object is sensed to generate a sensing signal. The sensing signal is amplified to generate an amplified signal. An analog-to-digital converter is provided to convert the amplified signal into a digital signal according to a reference voltage by the analog-to-digital converter. The digital signal is amplified according to a target signal value, thereby approximating the signal value of the amplified digital signal to the target signal value. A spectral signal is output according to the amplified digital signal.

Based on the above, in the embodiments of the invention, the amplified signal is converted into the digital signal according to the reference voltage, the digital signal is amplified according to the target signal value, thereby approximating the signal value of the amplified digital signal to the target signal value, and the spectral signal is output according to the amplified digital signal. In this way, the user can obtain a spectrum measurement result that can be easily interpreted, without any hardware or software modification, so as to improve the convenience of use of the spectrometer.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
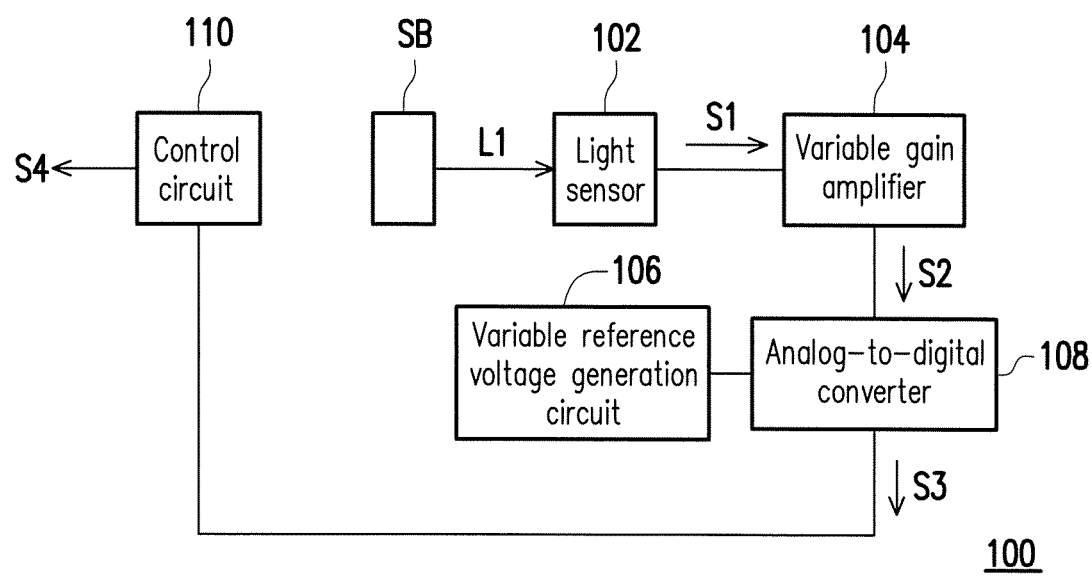
FIG. 1 is a schematic diagram of a spectrometer according to an embodiment of the invention.

FIG. 1 is a schematic diagram of a spectrometer according to an embodiment of the invention. Referring to FIG. 1, a spectrometer 100 includes a light sensor 102, a variable gain amplifier 104, a variable reference voltage generation circuit 106, an analog-to-digital converter (ADC) 108 and a control circuit 110. The variable gain amplifier 104 is coupled to the light sensor 102 and the analog-to-digital converter 108, the variable reference voltage generation circuit 106 is coupled to the analog-to-digital converter 108, and the analog-to-digital converter 108 is further coupled to the control circuit 110. The light sensor 102 is configured to sense light to be measured L1 from a testing object SB to generate a sensing signal S1 by means of converting an optical signal into an electric signal. The light sensor 102 is formed, for example, by integrating a photo diode or a photosensitive element with a circuit capable of optical-to-electric signal conversion, but the invention is not limited thereto. The variable gain amplifier 104 is configured to amplify the sensing signal S1 to generate an amplified signal S2. The variable gain amplifier 104 may be an amplifying circuit commonly known and used by those skilled in the art, but the invention is not limited thereto. The analog-to-digital converter 108 converts the amplified signal S2 in to a digital signal S3 according to a reference voltage provided by the variable reference voltage generation circuit 106 and amplifies the digital signal S3 according to a target signal value, thereby approximating a signal value of the amplified digital signal S3 to a target signal value. The control circuit 110 outputs a spectral signal S4 according to the amplified digital signal S3. For example, the spectral signal S4 may be output to a display apparatus (not shown) to display a spectral distribution corresponding to the testing object SB. The control circuit 110 is, for example, a central processing unit (CPU) or other programmable devices for general purpose or special purpose such as a microprocessor, a digital signal processor (DSP), a programmable controller, an application specific integrated circuit (ASIC), a programmable logic device (PLD) or other similar devices or a combination of above-mentioned devices, but the invention is not limited thereto. Likewise, the variable reference voltage generation circuit 106 and the analog-to-digital converter 108 may be a voltage generation circuit and an analog-to-digital converter commonly known and used by those skilled in the art, but the invention is not limited thereto.

In the contents described above, the operation of approximating the signal value of the amplified digital signal S3 to the target signal value may refer to, for example, rendering the change of the signal value of the amplified digital signal S3 fall within a predetermined range to prevent a spectrum displayed according to the spectral signal S4 from being unclear and hard to interpret due to a small signal value or small adjustment range of the signal value of the digital signal S3. The target signal value may be preset by a user, but the invention is not limited thereto. In addition, the spectrum displayed according to the spectral signal S4 may be prevent from failing to faithfully present spectral characteristics of the testing object SB due to the signal value of the digital signal S3 being amplified to exceed a signal value that the digital signal S3 is capable of representing.

As described above, the analog-to-digital converter 108 of the embodiment may convert the amplified signal S2 into the digital signal S3 according to the reference voltage provided by the variable reference voltage generation circuit 106 and amplifies the digital signal S3 according to the target signal value, thereby, approximating the signal value of the amplified digital signal S3 to the target signal value. In this way, even if a light intensity of the light to be measured L1 varies with measurement methods or different characteristics of the testing object, the control circuit 110 may still output the spectral signal S4 that is easy to interpret according to the received digital signal S3, without any hardware or software modification, so as to increase convenience of use of the spectrometer.

Figure 2:
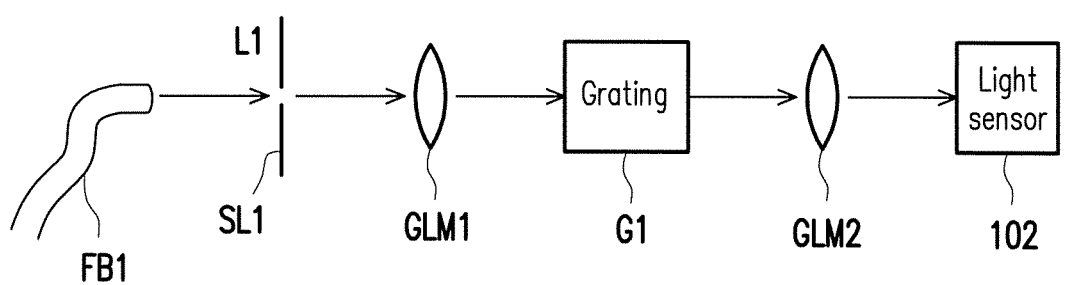
FIG. 2 is a schematic diagram of spectrum measurement using a fiber optic spectrometer.

For example, the spectrometer of the embodiment illustrated in FIG. 1 may be at least applied to methods of embodiments illustrated in FIG. 2 to FIG. 4 below (but the invention is not limited thereto), without raising an issue that a spectrum measurement result is hard to interpret. FIG. 2 is a schematic diagram of spectrum measurement using a fiber optic spectrometer. The fiber optic spectrometer collects the light to be measured L1 with a fiber optic cable FB1. The light to be measured may be, for example, reflected light (not shown) which is generated by ambient light irradiated on the testing object SB, but the invention is not limited thereto, and in some embodiments, the light to be measured L1 may also be reflected light which is generated by light provided by a specific light source (e.g., a tungsten lamp) and irradiated on the testing object SB. As illustrated in FIG. 2, the light to be measured L1 collected with the fiber optic cable FB1 passing through an incident slit SL1 and then a lens module GLM1 is guided to an optical grating G1 for light splitting, and then guided to the light sensor 102 through a lens module GLM2 for spectrum sensing analysis. The lens module GLM1 or the lens module GLM2 may be a lens or composed of a plurality of lenses, which is not limited in the invention.

Figure 3:
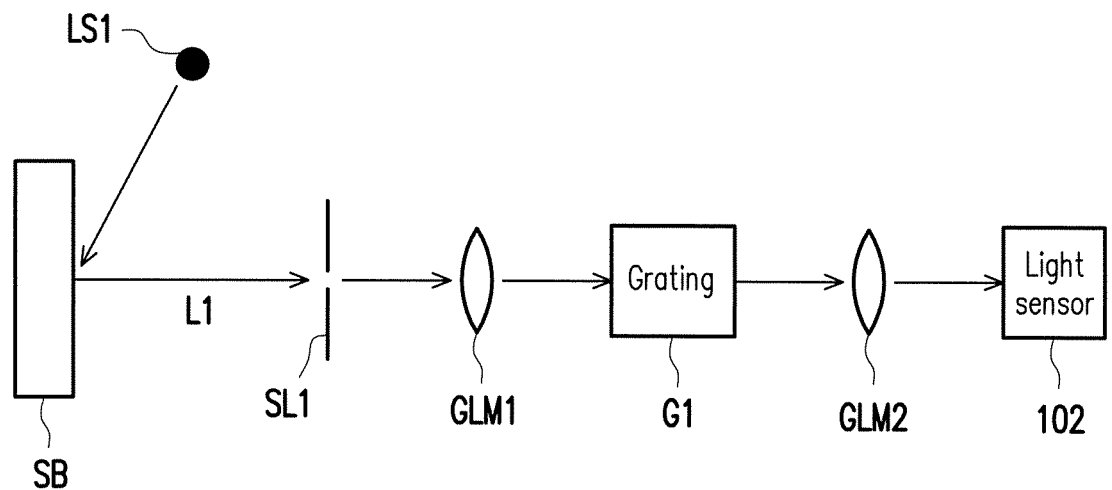
FIG. 3 is a schematic diagram of spectrum measurement using a reflective spectrometer.

FIG. 3 is a schematic diagram of spectrum measurement using a reflective spectrometer. Referring to FIG. 3, the reflective spectrometer generates the light to be measured L1 by irradiating the light provided by a light source LS1 on the testing object SB and then reflecting a part of the light beam by the testing object SB. The light to be measured L1 passing through the incident slit SL1 and then the lens module GLM1 is guided to the optical grating G1 for light splitting, and then guided to the light sensor 102 through the lens module GLM2 for spectrum sensing analysis.

Figure 4:
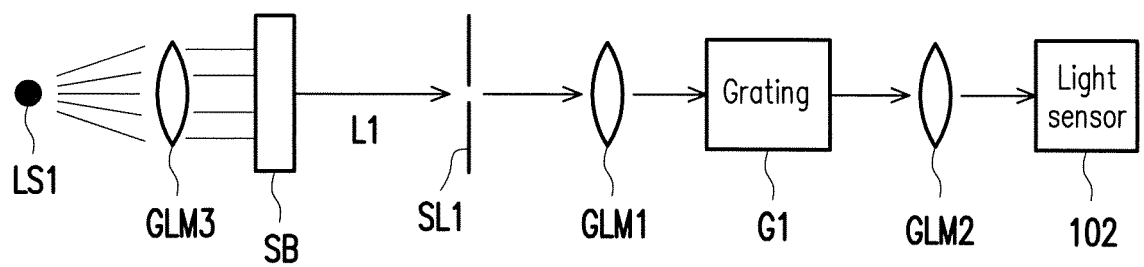
FIG. 4 is a schematic diagram of spectrum measurement using a transmissive spectrometer.

FIG. 4 is a schematic diagram of spectrum measurement using a transmissive spectrometer. Referring to FIG. 4, light provided by a light source LS1 of the transmissive spectrometer is evenly transmitted to the testing object SB through a lens module GLM3 to penetrate the testing object SB to generate the light to be measured L1. The testing object SB may be, for example, a transparent container filled with a liquid to be tested, but the invention is not limited thereto. The light to be measured L1 passing through the incident slit SL1 and then the lens module GLM1 is guided to the optical grating G1 for light splitting, and then, guided to the light sensor 102 through the lens module GLM2 for spectrum sensing analysis.

In addition, because both a gain value of the variable gain amplifier 104 and the reference voltage provided by the variable reference voltage generation circuit 106 are adjustable, in some embodiments, the digital signal S3 may be approximated to the target signal value by adjusting the reference voltage provided by the variable reference voltage generation circuit 106 if the digital signal S3 fails to be approximated to the target signal value according to the reference voltage used by the analog-to-digital converter 108. The reference voltage provided by the variable reference voltage generation circuit 106 may serve as a basic voltage used by the analog-to-digital converter 108 to generate the digital signal S3, and the signal value of the digital signal S3 increases or decreases according to a voltage level of the reference voltage. In addition, the gain value of the variable gain amplifier 104 may also be increasingly adjusted to change a size of a signal value of the amplified signal S2, such that the analog-to-digital converter 108 may easily adjust the signal value of the digital signal S3 to be approximate to the target signal value. The reference voltage and the gain value may be switched and adjusted by the user using, for example, a manual switch disposed on the spectrometer 100. In some embodiments, the control circuit 110 may be coupled to the variable reference voltage generation circuit 106 and the variable gain amplifier 104 and control the variable reference voltage generation circuit 106 and the variable gain amplifier 104 to adjust the reference voltage and the gain value according to the digital signal S3.

Figure 5:
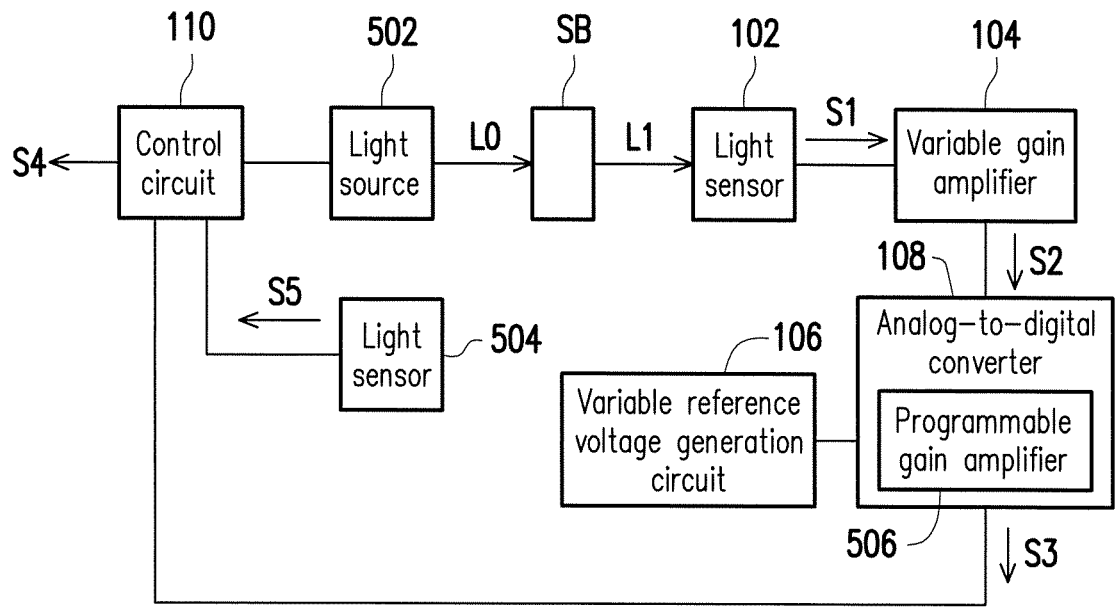
FIG. 5 is a schematic diagram of a spectrometer according to another embodiment of the invention.

It should be noted that in the embodiments above, if the light to be measured L1 is generated by the light which is provided by a specific light source and irradiated on the testing object SB, the spectrum measurement result may also be influenced due to attenuation of an intensity of the light provided by the light source. FIG. 5 is a schematic diagram of a spectrometer according to another embodiment of the invention. In the embodiment, a spectrometer 500 in comparison with the spectrometer 100 of the embodiment illustrated in FIG. 1 further includes a light source 502 and a light sensor 504 coupled to the control circuit 110. Additionally, the analog-to-digital converter 108 further includes a programmable gain amplifier 506. The light source 502 is controlled by the control circuit 110 to generate irradiation light L0 to irradiate on the testing object SB to generate the light to be measured L1. The light source 502 is, for example, a tungsten lamp or a light-emitting diode (LED), but the invention is not limited thereto. The control circuit 110 may adjust the intensity of the irradiation light L0 by, for example, changing a voltage or a current provided to the light source 502, or by changing a duty ratio of a pulse width modulation (PWM) signal provided to the light source 502. The light sensor 504 is configured to sense the light intensity of the irradiation light L0 to generate a light intensity sensing signal S5. The light sensor 504 may be, for example, the light sensor 102 illustrated in FIG. 1 and will not be repeatedly described. The control circuit 110 may adjust the light intensity of the irradiation light L0 according to the light intensity sensing signal S5. For example, when a value of the light intensity sensing signal S5 is smaller than a predetermined value, the light intensity of the irradiation light L0 is increased to prevent the light intensity of the irradiation light L0 from being attenuated due to the light source 502 being aged, thereby, preventing the spectrum measurement result from being influenced. In addition, the programmable gain amplifier 506 is configured to amplify the digital signal S3 and adjust a gain value of the programmable gain amplifier 506 according to the target signal value and the signal value of the digital signal S3, thereby approximating the signal value of the amplified digital signal S3 to the target signal value. The programmable gain amplifier 506 may be a gain amplifier commonly known and used by those skilled in the art, but the invention is not limited thereto. The adjustment method of the programmable gain amplifier 506 may refer to the embodiments set forth above and will not be repeatedly described here.

In some embodiments, the control circuit 110 may control the light source 502 to adjust the light intensity of the irradiation light L0 not only according to the light intensity sensing signal S5 provided by the light sensor 504, but also according to the digital signal S3. For example, when the signal value of the digital signal S3 decreases, the control circuit 110 may also increase the signal value of the digital signal S3 through increasing the light intensity of the irradiation light L0 to prevent the spectrum measurement result from being influenced due to the light intensity of the irradiation light L0 being attenuated.

Figure 6:
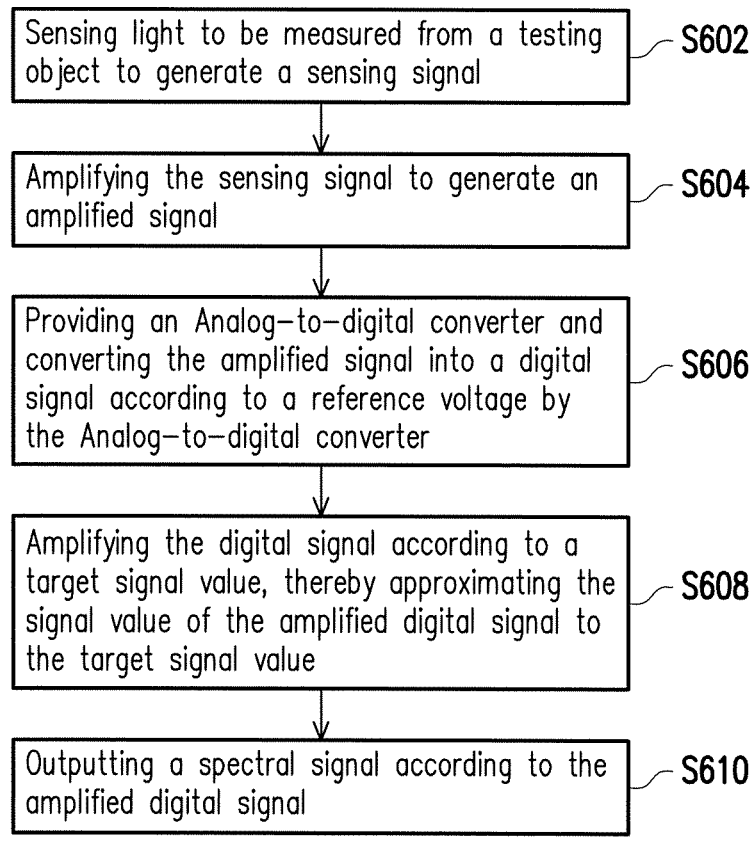
FIG. 6 is a flowchart of a spectrum measurement method of a spectrometer according to an embodiment of the invention.

FIG. 6 is a flowchart of a spectrum measurement method of a spectrometer according to an embodiment of the invention. Referring to FIG. 6, according to the embodiments described above, a spectrum measurement method of a spectrometer includes at least the following steps. First, light to be measured from a testing object is sensed to generate a sensing signal (step S602). Then, the sensing signal is amplified to generate an amplified signal (step S604). Thereafter, an analog-to-digital converter is provided to convert the amplified signal into a digital signal according to a reference voltage by using the analog-to-digital converter (step S606). Furthermore, the analog-to-digital converter may include a programmable gain amplifier configured to amplify the digital signal and adjust a gain value of the programmable gain amplifier according to a target signal value and a signal value of the digital signal, thereby approximating a signal value of the amplified digital signal to the target signal value. In addition, the signal value of the digital signal increases as a voltage level of the reference voltage decreases. Then, the digital signal is amplified according to the target signal value, thereby approximating the signal value of the amplified digital signal to the target signal value (step S608). Finally, a spectral signal is output according to the amplified digital signal (step S610). In some embodiments, in step S604, the gain value of the sensing signal may be adjusted and amplified according to the amplified digital signal, thereby approximating the signal value of the amplified digital signal to the target signal value.

Figure 7:
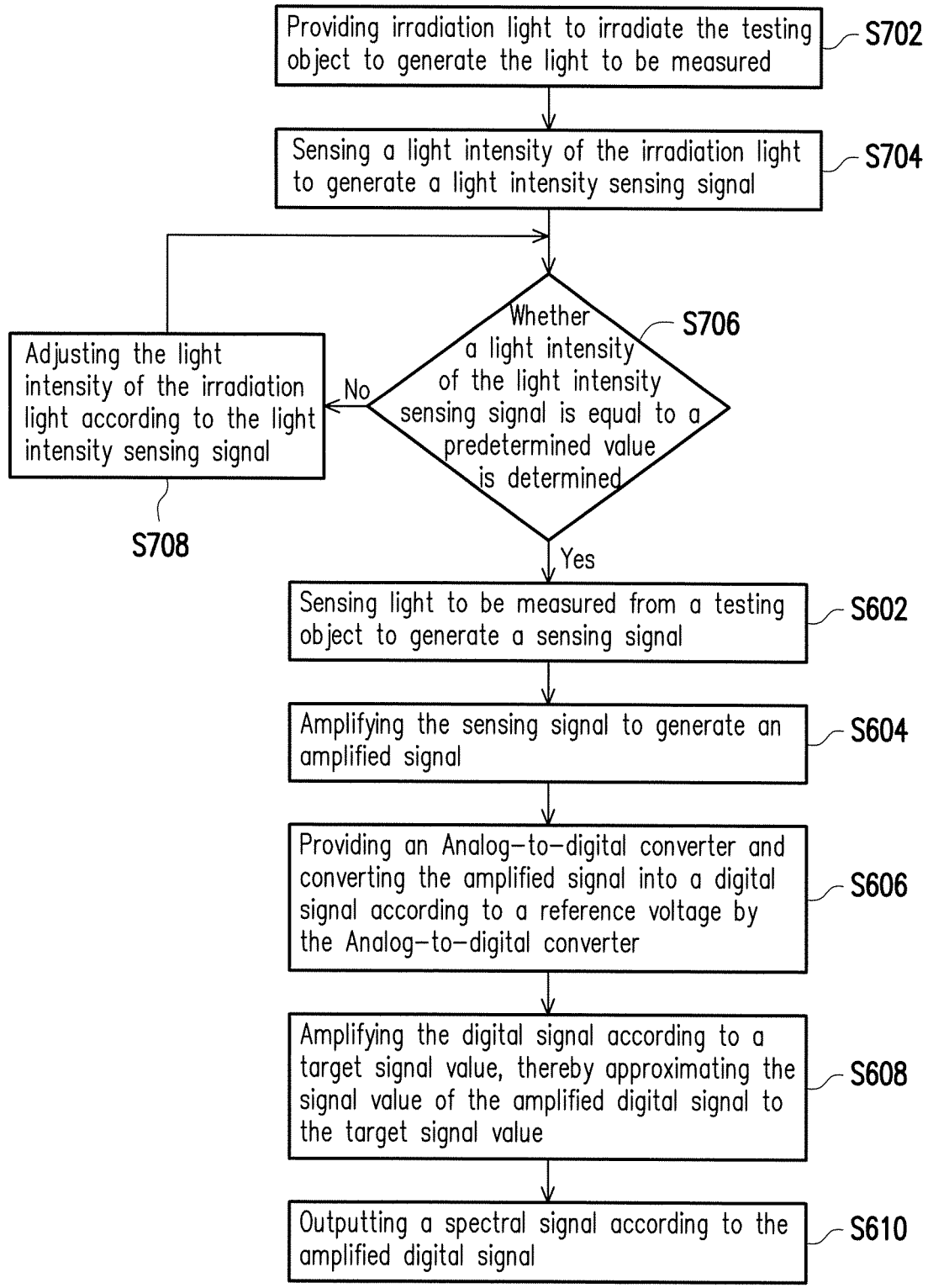
FIG. 7 is a flowchart of a spectrum measurement method of a spectrometer according to another embodiment of the invention.

FIG. 7 is a flowchart of a spectrum measurement method of a spectrometer according to another embodiment of the invention. Referring to FIG. 7, in comparison the spectrum measurement method of the spectrometer of the embodiment illustrated in FIG. 6, the spectrum measurement method of the embodiment further includes providing irradiation light to irradiate the testing object to generate the light to be measured (step S702). Thereafter, a light intensity of the irradiation light is sensed to generate a light intensity sensing signal (step S704), and then, whether a light intensity of the light intensity sensing signal is equal to a predetermined value is determined (step S706). If the light intensity of the light intensity sensing signal is not equal to the predetermined value, the light intensity of the irradiation light is first adjusted according to the light intensity sensing signal (step S708), and step S602 is entered to perform the subsequent steps (i.e., step S602 to S610) of measuring a spectrum. In some embodiments, step S708 may also include a step of adjusting the light intensity of the irradiation light according to the amplified digital signal. By contrast, if the light intensity of the light intensity sensing signal is equal to the predetermined value, step S602 is directly entered to perform the subsequent steps (i.e., step S602 to S610) of measuring a spectrum.

To sum up, in the embodiments of the invention, the amplified signal is converted into the digital signal according to the reference voltage, the digital signal is amplified according to the target signal value, thereby, the signal value of the amplified digital signal can be approximated to the target signal value, and the spectral signal is output according to the amplified digital signal. In this way, even if the light intensity of the light to be measured varies with measurement methods or different characteristics of the testing object, the control circuit can output the spectral signal that is easy to interpret, without any hardware or software modification, so as to increase the convenience of use of the spectrometer.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A spectrometer, comprising:
   a first light sensor, sensing light to be measured from a testing object to generate a sensing signal;
   a variable gain amplifier, coupled to the first light sensor to amplify the sensing signal to generate an amplified signal;
   a variable reference voltage generation circuit, providing a reference voltage;
   an analog-to-digital converter, coupled to the variable gain amplifier and the variable reference voltage generation circuit, converting the amplified signal into a digital signal according to the reference voltage and amplifying the digital signal according to a target signal value, thereby approximating a signal value of the amplified digital signal to the target signal value; and
   a control circuit, coupled to the analog-to-digital converter and output a spectral signal according to the amplified digital signal.

2. The spectrometer according to claim 1, further comprising:
   a light source, coupled to the control circuit, controlled by the control circuit to generate irradiation light to irradiate the testing object to generate the light to be measured; and
   a second light sensor, coupled to the control circuit to sense a light intensity of the irradiation light to generate a light intensity sensing signal, wherein the control circuit adjusts the light intensity of the irradiation light according to the light intensity sensing signal.

3. The spectrometer according to claim 2, wherein the control circuit further adjusts the light intensity of the irradiation light according to the amplified digital signal.

4. The spectrometer according to claim 1, wherein the analog-to-digital converter comprises:
   a programmable gain amplifier, amplifying the digital signal and adjusting a gain value of the programmable gain amplifier according to the target signal value and the signal value of the digital signal, thereby approximating the signal value of the amplified digital signal to the target signal value.

5. The spectrometer according to claim 1, wherein the control circuit is further coupled to the variable gain amplifier and adjusts a gain value of the variable gain amplifier according to the amplified digital signal.

6. The spectrometer according to claim 1, wherein the signal value of the digital signal increases as a voltage level of the reference voltage decreases.

* * * * *